(12) United States Patent
Onishi et al.

(10) Patent No.: US 9,443,766 B2
(45) Date of Patent: Sep. 13, 2016

(54) METHOD FOR MANUFACTURING DIODE

(71) Applicant: Toyota Jidosha Kabushiki Kaisha, Toyota-shi, Aichi-ken (JP)

(72) Inventors: Toru Onishi, Nagoya (JP); Yuichiro Matsuura, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 15/009,045

(22) Filed: Jan. 28, 2016

(65) Prior Publication Data

US 2016/0233130 A1    Aug. 11, 2016

(30) Foreign Application Priority Data

Feb. 9, 2015   (JP) ................. 2015-023321

(51) Int. Cl.
  *H01L 29/06*       (2006.01)
  *H01L 21/8222*     (2006.01)
  *H01L 29/66*       (2006.01)
  *H01L 27/07*       (2006.01)
  *H01L 21/266*      (2006.01)

(52) U.S. Cl.
  CPC ......... *H01L 21/8222* (2013.01); *H01L 21/266* (2013.01); *H01L 27/0716* (2013.01); *H01L 29/6609* (2013.01); *H01L 29/66348* (2013.01)

(58) Field of Classification Search
  CPC ............... H01L 2924/00; H01L 2924/00014; H01L 2924/12032; H01L 2924/1305; H01L 2924/13055; H01L 29/7813; H01L 29/1095; H01L 29/407; H01L 29/7802
  See application file for complete search history.

(56) References Cited

U.S. PATENT DOCUMENTS

| 7,465,986 B2* | 12/2008 | Girdhar ................. H01L 29/407 257/330 |
| 9,245,985 B2* | 1/2016 | Tang ................... H01L 29/7397 |
| 2002/0185705 A1* | 12/2002 | Saitoh ................. H01L 21/3247 257/492 |
| 2011/0233684 A1* | 9/2011 | Matsushita ......... H01L 29/1095 257/378 |
| 2013/0069694 A1* | 3/2013 | Saito ..................... H03K 17/00 327/109 |
| 2014/0048847 A1* | 2/2014 | Yamashita ........... H01L 29/407 257/140 |

FOREIGN PATENT DOCUMENTS

| JP | 2000-323488 A | 11/2000 |
| JP | 2013-048230 A | 3/2013 |

* cited by examiner

Primary Examiner — Jaehwan Oh
(74) Attorney, Agent, or Firm — Dinsmore & Shohl LLP

(57) ABSTRACT

A diode manufacturing method provided herein includes first-third implantations and a heating. The first implantation implants n-type impurities into a first range at a first depth. The second implantation implants n-type impurities into a second range including the first range as a part at a second depth shallower than the first depth. The third implantation implants p-type impurities into a third range located on both sides of the second range at a third depth shallower than the first depth at a density higher than the second implantation. The semiconductor substrate is heated in the heating so that a first p-type region (contact region) is formed in the implanted region in the third implantation and a first n-type region (pillar region) is formed in a part of the implanted region in the first and second implantations.

5 Claims, 9 Drawing Sheets

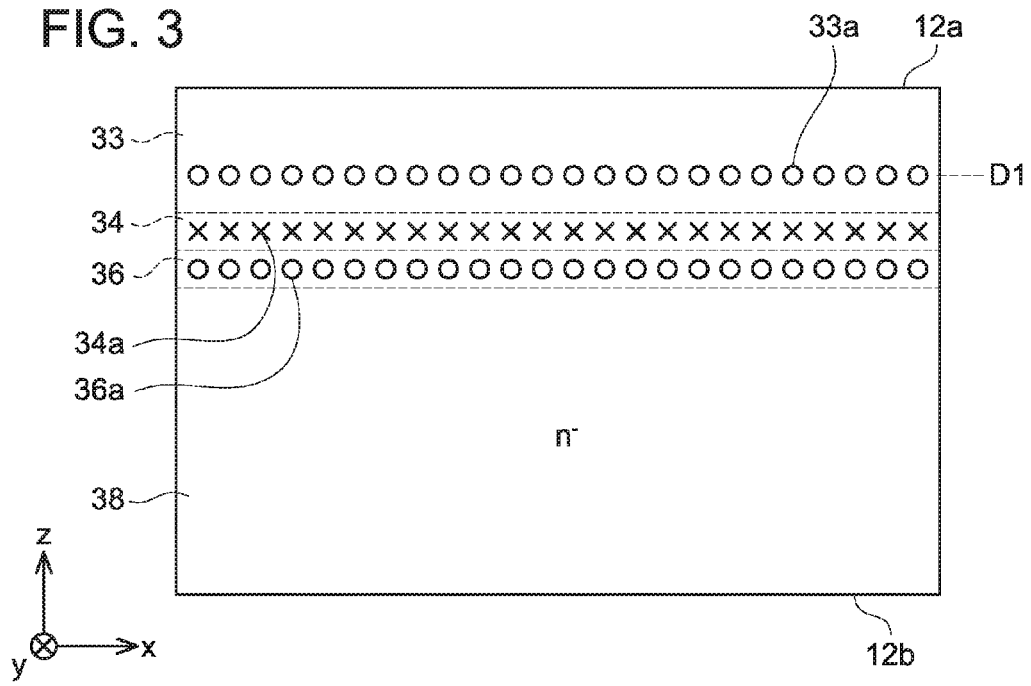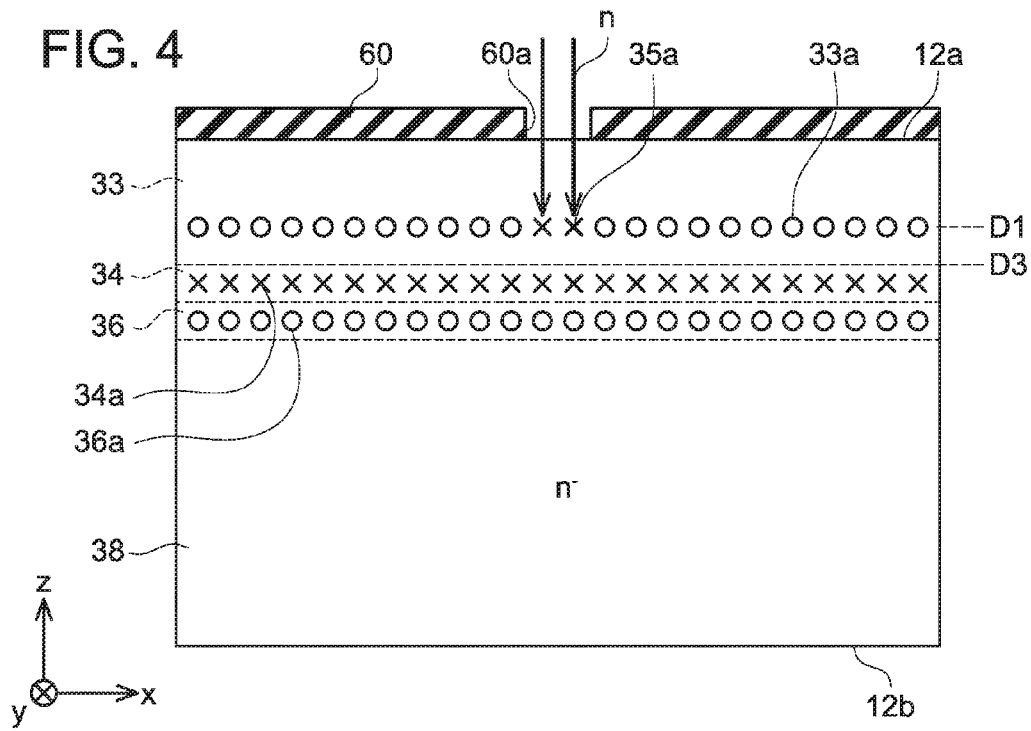

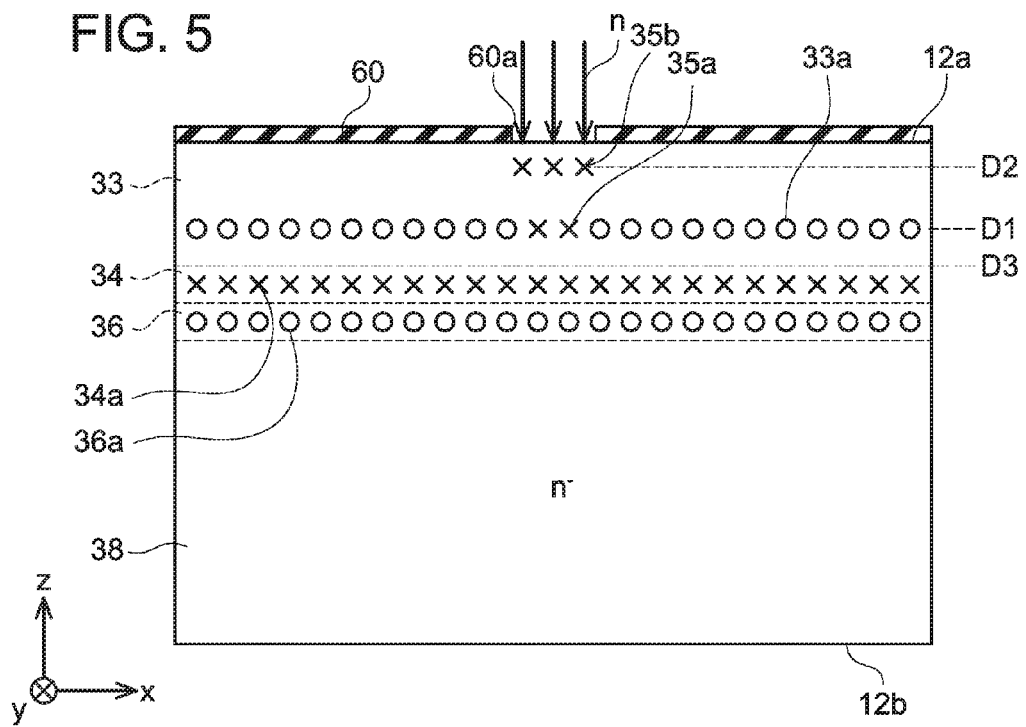
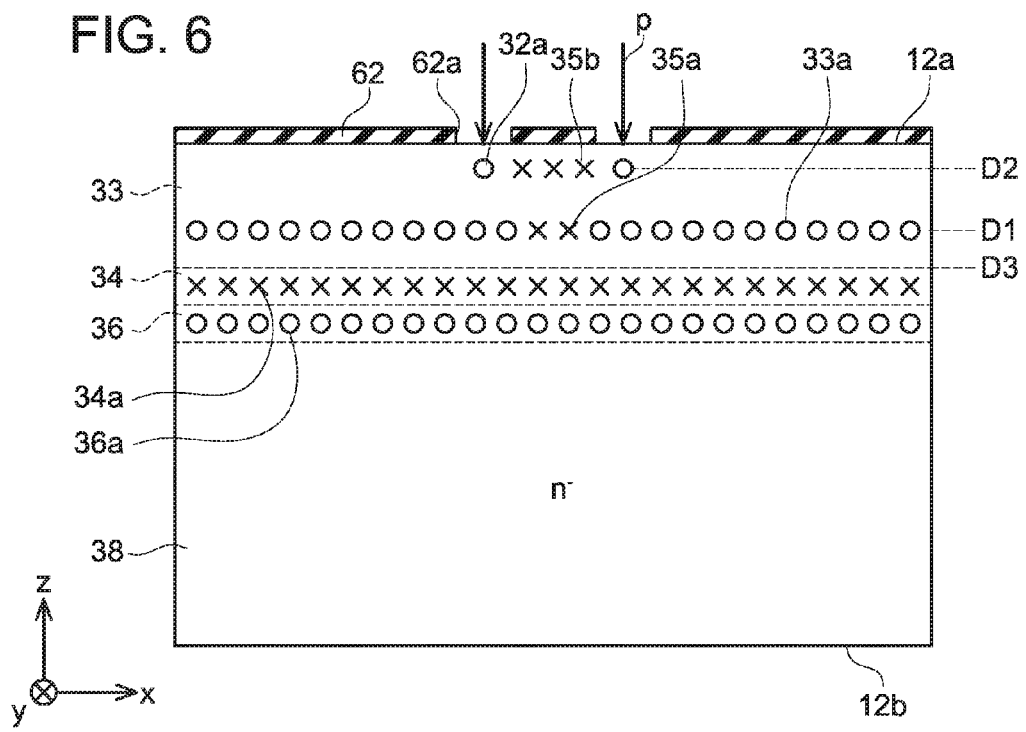

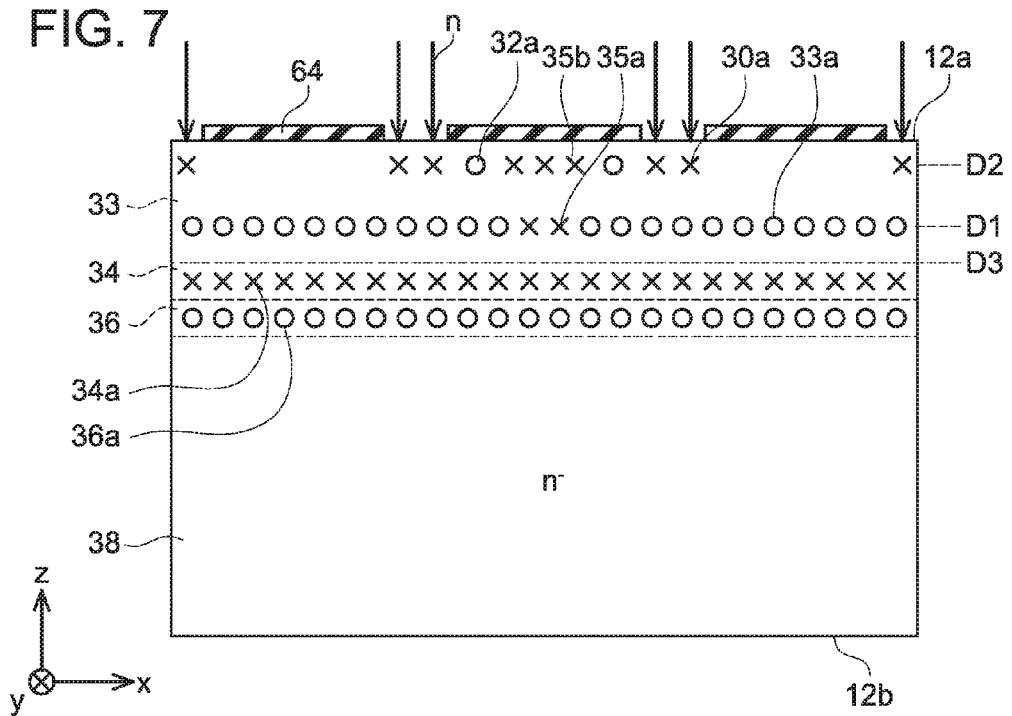
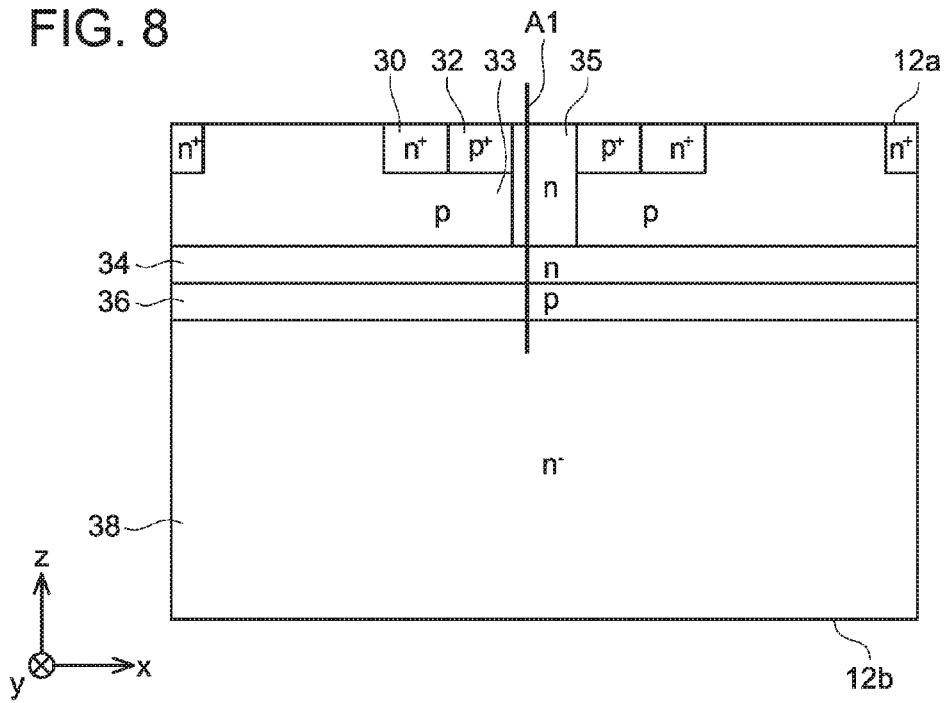

METHOD FOR MANUFACTURING DIODE

CROSS-REFERENCE TO RELATED APPLICATION

This application claims priority to Japanese Patent Application No. 2015-023321 filed on Feb. 9, 2015, the contents of which are hereby incorporated by reference into the present application.

TECHNICAL FIELD

The technology disclosed in the present specification relates to a method for manufacturing a diode.

DESCRIPTION OF RELATED ART

Japanese Patent Application Publication No. 2013-48230 (hereinafter referred to as Patent Document 1) discloses a diode that can suppress hole injection from a p-type region to an n-type region. This diode has a barrier region, a body region, a contact region, and a pillar region. The barrier region is of n-type and extends in a lateral direction of a semiconductor substrate like a layer. The body region is of p-type and formed on an upper side of the barrier region. The contact region is of p-type and contains p-type impurities at a density higher than that in the body region. The contact region is formed on an upper side of the body region and in contact with an anode electrode. The pillar region is of n-type. The pillar region extends from an upper surface of the semiconductor substrate to the barrier region by penetrating the body region. The pillar region is in contact with the anode electrode. In other words, the pillar region connects the barrier region and the anode electrode. In this diode, when a potential of the anode electrode is increased, a current path configured with the pillar region and the barrier region is initially turned on. Therefore, a potential difference is difficult to be generated at a pn junction of an interface between the body region and the barrier region. When the potential of the anode electrode is further increased, the potential difference at the above-described pn junction increases, and the above-described pn junction is turned on, resulting in holes flowing from the body region into n-type regions on a barrier region side. As such, in this diode, a timing at which the pn junction is turned on is delayed, and hence holes are difficult to flow from the p-type region into the n-type region. In other words, in this diode, a hole injection suppressing effect can be obtained. Afterwards, when a reverse voltage is applied to the diode, the diode performs a reverse recovery operation, and the holes that exist in the n-type region are discharged to the anode electrode. In this diode, since inflow of holes from the p-type region to the n-type region is suppressed in an on-operation as described above, an amount of holes discharged from the n-type region to the anode electrode in the reverse recovery operation is small. Therefore, a reverse recovery current is suppressed in this diode.

BRIEF SUMMARY

In the technology in Patent Document 1, a spacing is provided between the pillar region and the contact region, and the body region (the p-type region having a density of p-type impurities lower than that in the contact region) exists in that spacing. To further downsize a diode, the inventors of the present application studied an effect of forming the pillar region adjacent to the contact region, in other words, forming the contact region to be adjacent to both sides of the pillar region. However, it was revealed that, since the contact region had a high density of p-type impurities, the p-type impurities diffused toward the pillar region side when heat treatment was performed for forming the pillar region and the contact region, causing a decrease in width of the pillar region in a vicinity of a surface of the semiconductor substrate. In other words, the width of the pillar region becomes smaller at a shallow position (i.e., a part sandwiched by the contact region(s)) than at a deep position. If the width of the pillar region becomes smaller at the shallow position, resistance of the pillar region is increased. Consequently, a potential difference is easily generated at the pn junction of the interface between the body region and the barrier region, and accordingly the hole injection suppressing effect described above is difficult to be obtained. On the other hand, if the width of the pillar region is increased at the shallow position so as to reduce the resistance in the pillar region, the width of the pillar region at the deep position is unnecessarily increased, causing an increase in element size. As such, it has conventionally been difficult to obtain both a high hole injection suppressing effect and a small element size. Therefore, the present specification provides a technology that can obtain both a high hole injection suppressing effect and a small element size, in a diode having a pillar region.

A diode manufactured by a method disclosed herein includes an anode electrode; a contact region being of p-type and in contact with the anode electrode; a body region being of p-type, located on a lower side of the contact region, and having a density of p-type impurities lower than that in the contact region; a barrier region being of n-type and located on a lower side of the body region; and a pillar region being of n-type and extending from a position being in contact with the anode electrode to the barrier region by penetrating the contact region and the body region. The method comprises first to third implantations and a first heating. In the first implantation, n-type impurities are implanted into a first range of an upper surface of a semiconductor substrate at a first depth. In the second implantation, the n-type impurities are implanted into a second range of the upper surface at a second depth. The second range includes the first range as a part. The second depth is shallower than the first depth. In the third implantation, the p-type impurities are implanted into a third range of the upper surface at a third depth at a density higher than a density of the n-type impurities implanted in the second implantation. The third range is located on both sides of the second range. The third depth is shallower than the first depth. In the first heating, the semiconductor substrate is heated so that a first p-type region is formed in a region into which the p-type impurities are implanted in the third implantation and a first n-type region is formed in a part of a region into which the n-type impurities are implanted in the first and second implantations. The first p-type region serves as the contact region, and the first n-type region serves as the pillar region.

Note that the first, second, and third implantations may be performed in any order. Furthermore, the anode electrode, the body region, and the barrier region may be formed in any process at any timing.

In this manufacturing method, the first and second implantation are performed so as to form the pillar region. In the second implantation for a shallow position (the second depth), the n-type impurities are implanted into the range (the second range) wider than the implantation range (the first range) of the first implantation for the deep position (the first depth). In other words, the second range includes the first range and has a width larger than that of the first range. Accordingly, after the first and second implantations are performed, the n-type impurities are distributed in the lateral direction wider at the shallow position than at the deep position, in the region the pillar region is to be formed. Furthermore, in the third implantation step, the p-type impurities are implanted into the third range (i.e., the region where the contact region is to be formed) at a high density, the third range being located on both sides of the range where the n-type impurities are implanted in the second implantation (the second range). In the third implantation, the p-type impurities are implanted at the shallow position (the third depth). When the heating step is performed thereafter, the n-type and p-type impurities implanted in the first to third implantation steps are activated, and the pillar region and the contact region are formed. In the heating, the p-type impurities are diffused from the contact region toward a pillar region side at the shallow position. Therefore, the contact region is formed enlarged toward the pillar region side with respect to the implantation range of the p-type impurities (the third range). Accordingly, the pillar region is formed in a range narrower than the implantation range (the second range) in the second implantation, at the shallow position. On the other hand, the pillar region is formed in a range corresponding to the first range, at the deep position. The first range is narrower than the second range, and hence even if the width of the pillar region is reduced at the shallow position, the width of the pillar region is prevented from being excessively smaller at the shallow position than at the deep position. In other words, a width difference in the pillar region between the shallow position and the deep position is difficult to be generated. Therefore, according to this method, the width of the pillar region can be more uniform than it could have been conventionally. Accordingly, resistance of the pillar region can be reduced without unnecessarily increasing the width of the pillar region at a particular depth.

BRIEF DESCRIPTION OF DRAWINGS

FIG. 3 is an explanatory diagram of an ion implantation step for a lower body region 36, a barrier region 34, and an upper body region 33;

FIG. 4 is an explanatory diagram of an ion implantation step for a deep part of a pillar region 35;

FIG. 5 is an explanatory diagram of an ion implantation step for a shallow part of the pillar region 35;

FIG. 6 is an explanatory diagram of an ion implantation step for a contact region 32;

FIG. 7 is an explanatory diagram of an ion implantation step for an emitter region 30;

FIG. 8 is a vertical cross section of a semiconductor substrate 12 after activation annealing;

DETAILED DESCRIPTION

Figure 1:
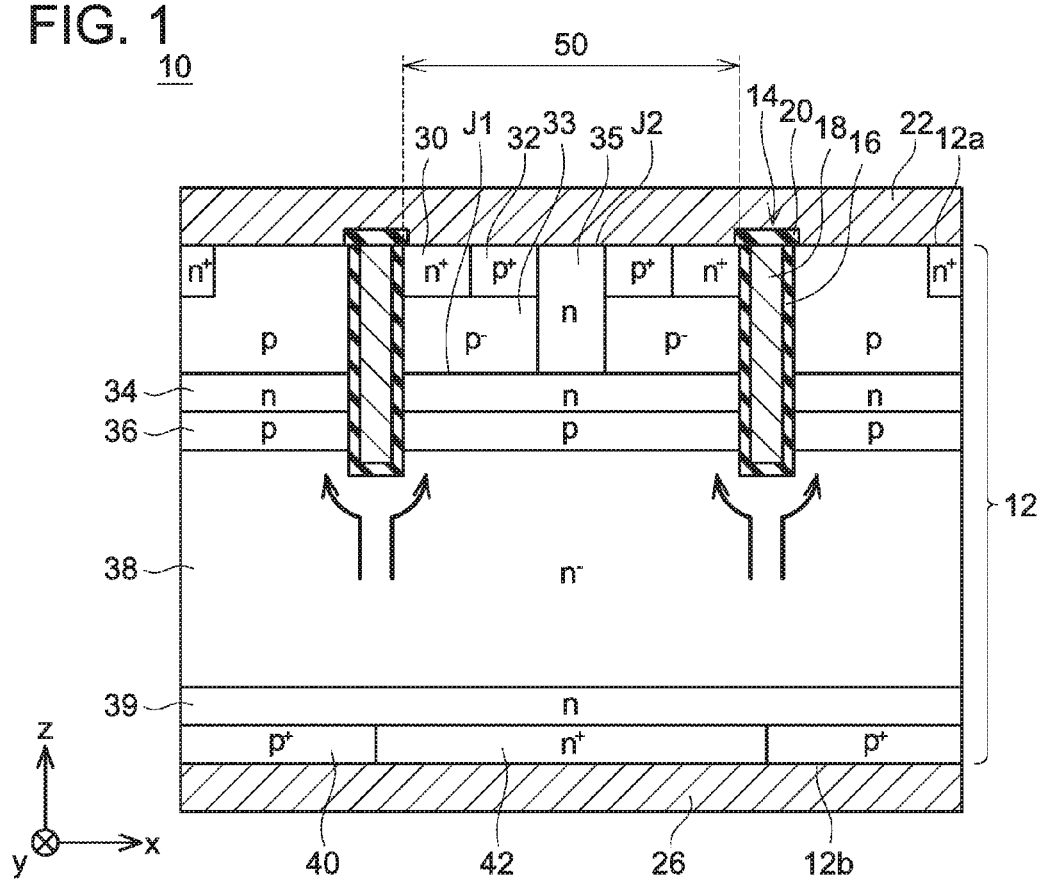
FIG. 1 is a vertical cross section of a semiconductor device 10.
Figure 2:
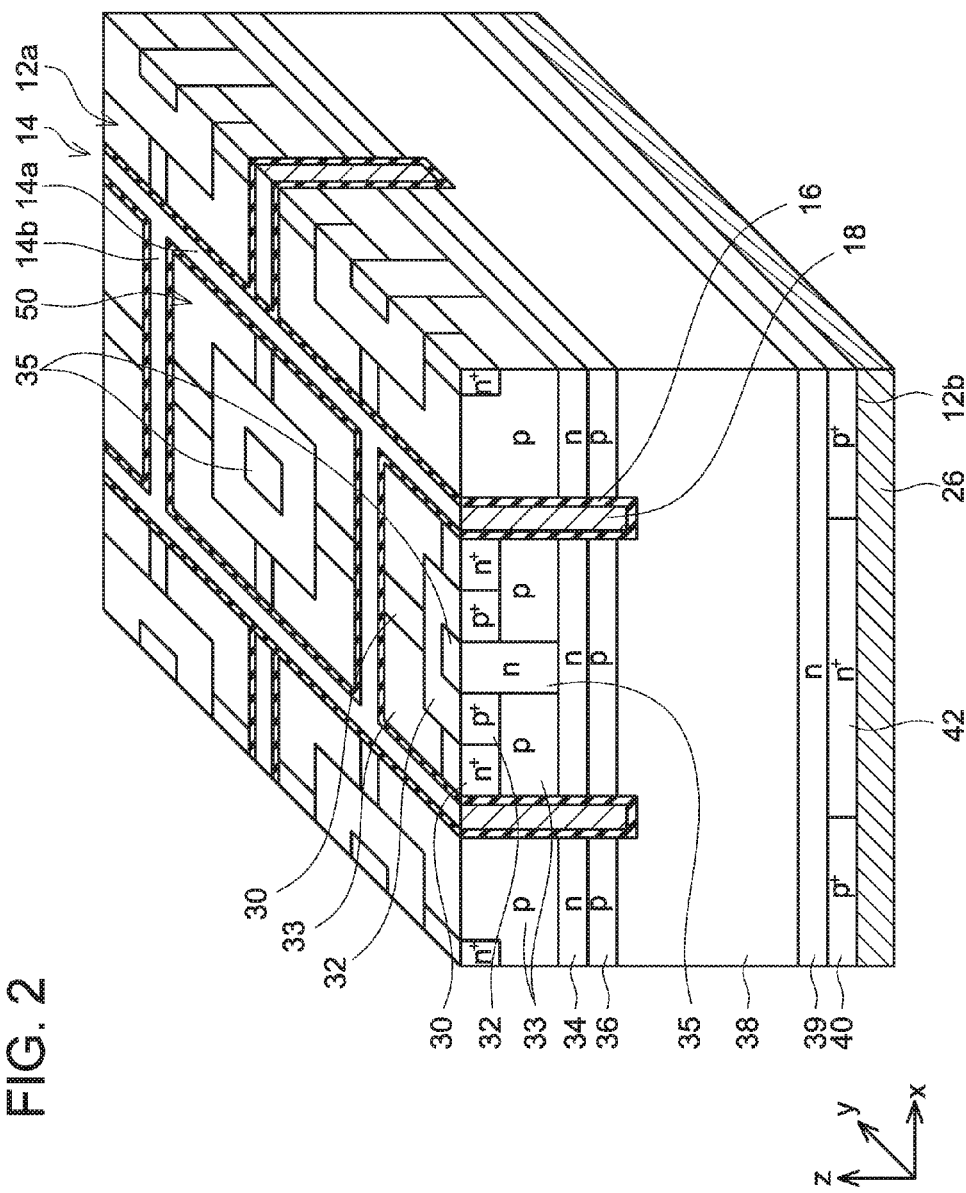
FIG. 2 is a diagram that shows a cross section and an upper surface of the semiconductor device 10, with an upper electrode 22 and interlayer insulation films 20 being omitted.

FIGS. 1 and 2 show a semiconductor device 10 manufactured by a method according to an embodiment. The semiconductor device 10 is an RC-IGBT that includes diodes and IGBTs. The semiconductor device 10 has a semiconductor substrate 12 configured of Si. Note that, in FIGS. 1 and 2, a z-direction is a thickness direction of the semiconductor substrate 12, an x-direction is one direction parallel to an upper surface 12a of the semiconductor substrate 12, and a y-direction is a direction orthogonal to the z- and x-directions. An upper electrode 22 is formed at the upper surface 12a of the semiconductor substrate 12, whereas a lower electrode 26 is provided at a lower surface 12b of the semiconductor substrate 12.

Trenches 14 are provided in the upper surface 12a of the semiconductor substrate 12. The trenches 14 include first parts 14a each of which linearly extends along the y-direction and second parts 14b each of which linearly extends along the x-direction. The first and second parts 14a and 14b are connected to each other, thereby causing the upper surface 12a of the semiconductor substrate 12 to be partitioned like a grid. The trenches 14 extend from the upper surface 12a of the semiconductor substrate 12 along the z-direction (the downward direction). Note that each of semiconductor regions located within ranges surrounded by the grid-like trenches 14 will hereinafter be referred to as a partitioned region 50.

An inner surface of each trench 14 is covered by a gate insulation film 16. A gate electrode 18 is located in each trench 14. The gate electrode 18 is insulated from the semiconductor substrate 12 by the corresponding gate insulation film 16. The gate electrode 18 and the gate insulation film 16 configure a gate trench. An upper surface of each gate electrode 18 is covered by an interlayer insulation film 20. Each gate electrode 18 is insulated from the upper electrode 22 by the corresponding interlayer insulation film 20.

Inside the semiconductor substrate 12, emitter regions 30, contact regions 32, upper body regions 33, barrier regions 34, pillar regions 35, lower body regions 36, a drift region 38, a buffer region 39, collector regions 40, and a cathode region 42 are provided.

Each pillar region 35 is an n-type semiconductor region. The pillar region 35 is provided at a center of each partitioned region 50. The pillar region 35 is exposed at the upper surface 12a of the semiconductor substrate 12, and is in Schottky-contact with the upper electrode 22. The pillar region 35 extends from the upper surface 12a along the negative z-direction (the downward direction).

Each contact region 32 is a p-type semiconductor region. The contact region 32 is provided in each partitioned region 50. The contact region 32 is adjacent to the pillar region 35. The contact region 32 is shaped in a ring that surrounds a periphery of the pillar region 35. A density of p-type impurities in the contact region 32 is high. More specifically, the density of p-type impurities in the contact region 32 is higher than a density of n-type impurities in the pillar region 35. The contact region 32 is exposed on the upper surface 12a of the semiconductor substrate 12. The contact region 32 is in ohmic contact with the upper electrode 22. The contact region 32 is provided in a surface layer part of the semiconductor substrate 12 in a vicinity of the upper surface 12a. In other words, the contact region 32 is located in a region shallower than a lower end of the pillar region 35.

Each emitter region 30 is an n-type semiconductor region. The emitter regions 30 are provided in each partitioned region 50. Each emitter region 30 is provided between the contact region 32 and the corresponding trench 14. The emitter region 30 is in contact with the gate insulation film 16 located at a part of the corresponding trench 14 that linearly extends. The emitter region 30 is separated from the pillar region 35 by the contact region 32. A density of n-type impurities in the emitter region 30 is higher than the density of n-type impurities in the pillar region 35. The emitter region 30 is exposed on the upper surface 12a of the semiconductor substrate 12. The emitter region 30 is in ohmic contact with the upper electrode 22. The emitter region 30 is provided in the surface layer part of the semiconductor substrate 12 in the vicinity of the upper surface 12a. In other words, the emitter region 30 is provided in a region shallower than the lower end of the pillar region 35.

Each upper body region 33 is a p-type semiconductor region. A density of p-type impurities in the upper body region 33 is lower than the density of p-type impurities in the contact region 32. The upper body region 33 is provided in each partitioned region 50. The upper body region 33 is provided on a lower side of, and is in contact with, the emitter regions 30 and the contact region 32. Furthermore, the upper body region 33 is exposed on the upper surface 12a of the semiconductor substrate 12 in a range where the emitter regions 30 and the contact region 32 are not provided. The upper body region 33 is in contact with the gate insulation film 16 on the lower side of the emitter regions 30. The upper body region 33 is in contact with the pillar region 35 on the lower side of the contact region 32.

Each barrier region 34 is an n-type semiconductor region. The barrier region 34 is provided in each partitioned region 50. The barrier region 34 is provided on a lower side of the upper body region 33, and is in contact with the upper body region 33. The barrier region 34 extends planarly along the x- and y-directions on the lower side of the upper body region 33. The barrier region 34 is linked to the pillar region 35. In other words, the pillar region 35 extends from the upper surface 12a of the semiconductor substrate 12 to the barrier region 34 by penetrating the contact region 32 and the upper body region 33. The barrier region 34 is separated from the emitter regions 30 by the upper body region 33. The barrier region 34 is in contact with the gate insulation film 16 on the lower side of the upper body region 33.

Each lower body region 36 is a p-type semiconductor region. The lower body region 36 is provided in each partitioned region 50. The lower body region 36 is provided on a lower side of the barrier region 34, and is in contact with the barrier region 34. The lower body region 36 extends planarly along the x- and y-directions on the lower side of the barrier region 34. The lower body region 36 is separated from the upper body region 33 by the barrier region 34. The lower body region 36 is in contact with the gate insulation film 16 on the lower side of the barrier region 34.

The drift region 38 is an n-type semiconductor region. A density of n-type impurities in the drift region 38 is lower than the density of n-type impurities in the barrier region 34. The drift region 38 is provided on a lower side of the lower body regions 36, and is in contact with the lower body regions 36. The drift region 38 is provided on a lower side of the plurality of partitioned regions 50. The drift region 38 is separated from the barrier regions 34 by the lower body regions 36. The drift region 38 is in contact with the gate insulation films 16 on the lower side of the lower body regions 36.

The buffer region 39 is an n-type semiconductor region. A density of n-type impurities in the buffer region 39 is higher than the density of n-type impurities in the drift region 38. The buffer region 39 is provided on a lower side of the drift region 38, and is in contact with the drift region 38.

Each collector region 40 is a p-type semiconductor region. The collector region 40 has a density of p-type impurities higher than the densities of p-type impurities in the upper body regions 33 and the lower body regions 36. The collector region 40 is provided in a part of a region on a lower side of the buffer region 39, and is in contact with the buffer region 39. The collector region 40 is exposed on the lower surface 12b of the semiconductor substrate 12. The collector region 40 is in ohmic contact with the lower electrode 26.

The cathode region 42 is an n-type semiconductor region. The cathode region 42 has a density of n-type impurities higher than the densities of n-type impurities in the barrier region 34 and the pillar region 35. The cathode region 42 is provided in a part of the region on the lower side of the buffer region 39, and is in contact with the buffer region 39. The cathode region 42 is exposed on the lower surface 12b of the semiconductor substrate 12 at a position adjacent to the collector region 40. The cathode region 42 is in ohmic contact with the lower electrode 26.

In the semiconductor substrate 12, diodes are configured with the contact regions 32, the upper body regions 33, the barrier regions 34, the lower body regions 36, the drift region 38, the buffer region 39, the cathode region 42, and the like. Furthermore, in the semiconductor substrate 12, IGBTs are configured with the emitter regions 30, the upper body regions 33, the barrier regions 34, the lower body regions 36, the drift region 38, the buffer region 39, the collector regions 40, and the like. In other words, the diodes and the IGBTs are connected in anti-parallel between the upper electrode 22 and the lower electrode 26.

An operation of the IGBTs will be described. When the IGBTs are turned on, a potential higher than that of the upper electrode 22 is applied to the lower electrode 26. Furthermore, when a potential equal to or more than a threshold value is applied to the gate electrode 18, channels are formed in the upper and lower body regions 33 and 36, in a vicinity of the corresponding gate insulation films 16. Consequently, electrons flow from the upper electrode 22 toward the lower electrode 26 through the emitter regions 30, the channels of the upper body regions 33, the barrier regions 34, the channels of the lower body regions 36, the drift region 38, the buffer region 39, and the collector regions 40. Furthermore, holes flow from the lower electrode 26 toward the upper electrode 22 through the collector regions 40, the buffer region 39, the drift region 38, the lower body regions 36, the barrier regions 34, the upper body regions 33, and the contact regions 32. In other words, the IGBTs are turned on and current flows from the lower electrode 26 toward the upper electrode 22. Afterwards, when the potential of the gate electrode 18 is decreased to less than the threshold value, the channels disappear and the current stops. In other words, the IGBTs are turned off.

As shown in FIG. 1 by arrows, the holes flowing in the drift region 38 when the IGBTs are on avoid the trenches 14 and flow on both sides of the trenches 14. The holes are therefore collected in the drift region 38 in a vicinity of the lower body regions 36, causing a decrease in electric resistance of the drift region 38. An effect that resistance of the drift region 38 is decreased by the holes avoiding the trenches 14 being collected, is hereinafter referred to as a carrier accumulation effect. Since the carrier accumulation effect can be obtained in the drift region 38, electrons can pass through the drift region 38 with low loss. The carrier accumulation effect is more remarkable as the spacing between the two trenches 14 is made smaller. As described below, the semiconductor device according to the present embodiment can obtain a high carrier accumulation effect because a spacing between the two trenches 14 is made small. Accordingly, on-voltage of the IGBTs is low.

Next, an operation of the diodes will be described. When the diodes are turned on, a voltage (a forward voltage) that allows the upper electrode 22 to be at a higher potential is applied between the upper electrode 22 and the lower electrode 26. Hereinafter a case will be considered where the potential of the upper electrode 22 is gradually increased from a potential equivalent to that of the lower electrode 26. When the potential of the upper electrode 22 is increased, a Schottky-contact part J2 at each of interfaces between the pillar regions 35 and the upper electrode 22 is brought into conduction. Consequently, electrons flow from the lower electrode 26 toward the upper electrode 22 through the cathode region 42, the buffer region 39, the drift region 38, the lower body regions 36, the barrier regions 34, and the pillar regions 35. When the Schottky-contact part J2 is brought into conduction, the potential of the barrier regions 34 becomes a potential close to that of the upper electrode 22. Therefore, a potential difference is difficult to be generated at a pn junction J1 at each of boundaries between the upper body regions 33 and the barrier regions 34. Therefore, even if the potential of the upper electrode 22 is subsequently increased, the pn junction J1 is not turned on for a while. When the potential of the upper electrode 22 is further increased, a current that flows via the Schottky-contact part J2 is increased. Due to this, the potential difference between the upper electrode 22 and the barrier regions 34 becomes large, and the potential difference generated at the pn junction J1 also becomes large. Accordingly, when the potential of the upper electrode 22 is increased to equal to or more than a prescribed potential, the pn junction J1 (i.e., the diode) is turned on. In other words, holes flow from the upper electrode 22 toward the lower electrode 26 through the contact regions 32, the upper body regions 33, the barrier regions 34, the lower body regions 36, the drift region 38, the buffer region 39, and the cathode regions 42. Furthermore, electrons flow from the lower electrode 26 toward the upper electrode 22 through the cathode regions 42, the buffer region 39, the drift region 38, the lower body regions 36, the barrier regions 34, the upper body regions 33, and the contact regions 32. As such, in the semiconductor device 10, when the potential of the upper electrode 22 increases, the Schottky-contact part J2 is turned on earlier, thereby causing a delay in timing at which the pn junction J1 is turned on. Due to this, inflow of the holes from the upper body regions 33 to the barrier regions 34 and the drift region 38 is suppressed. In other words, the hole injection suppressing effect can be obtained.

When a reverse voltage (a voltage that allows the upper electrode 22 to be at a lower potential) is applied between the upper electrode 22 and the lower electrode 26 after the diodes are turned on, the diodes perform a reverse recovery operation. In other words, while the diodes are on, holes exist in the barrier regions 34 and the drift region 38. When a reverse voltage is applied, the holes in the barrier regions 34 and the drift region 38 are discharged to the upper electrode 22 through the upper body regions 33 and the contact regions 32. Due to this flow of holes, a reverse current (a so-called reverse recovery current) is instantaneously generated in the diodes. However, in the semiconductor device 10, when the diode is turned on, the Schottky-contact parts J2 are turned on to thereby suppress inflow of the holes from the upper body regions 33 to the barrier regions 34 and the drift region 38. Therefore, when the diodes perform the reverse recovery operation, an amount of holes discharged from the barrier regions 34 and the drift region 38 to the upper electrode 22 is small. Thus in the semiconductor device 10 according to the present embodiment, the reverse recovery current of the diodes is small.

Next, a method for manufacturing the semiconductor device 10 will be described. The semiconductor device 10 is manufactured from the n-type semiconductor substrate 12 that has a density of n-type impurities approximately equal to that in the drift region 38.

Initially, as shown in FIG. 3, impurities are implanted into the semiconductor substrate 12. Note that, in each diagram described below, each circular mark indicates a region where p-type impurities are implanted, while each x-mark indicates a region where n-type impurities are implanted. The present step will hereinafter be described in more detail. Initially, a mask (not shown) is formed at the upper surface 12a of the semiconductor substrate 12. This mask is one that covers a region where the IGBTs and the diodes are not to be formed, and an opening is provided in an entire upper range of each region where the IGBTs and the diodes are to be formed. Next, p-type impurities are implanted into the upper surface 12a of the semiconductor substrate 12 through the mask. Here, p-type impurities are implanted at a depth that corresponds to that of the lower body regions 36. Due to this, a p-type impurities implanted region 36a is formed. Next, the same mask is used again to implant n-type impurities at a depth that corresponds to that of the barrier regions 34. Due to this, an n-type impurities implanted region 34a is formed. Next, the same mask is used to implant p-type impurities at a depth D1 that corresponds to that of the upper body regions 33. Due to this, a p-type impurities implanted region 33a is formed. Note that, in the present specification, implanting impurities at a particular depth means that impurities are implanted such that the implanted impurities consequently stop on average at the particular depth described above. When the p-type impurities implanted region 33a is formed, the mask is removed.

Next, as shown in FIG. 4, a mask 60 is formed at the upper surface 12a of the semiconductor substrate 12. The mask 60 has openings 60a above regions where the pillar regions 35 are to be formed. Next, n-type impurities are implanted into the upper surface 12a of the semiconductor substrate 12 through the mask 60. In other words, n-type impurities are implanted into the upper surface 12a located in the openings 60a. Here, n-type impurities are implanted at a depth D1 (i.e., the depth approximately equal to a depth of the p-type impurities implanted region 33a). A depth D3 in FIG. 4 indicates a position of a boundary line between the upper body regions 33 and the barrier regions 34 when the semiconductor device 10 is completed. In other words, the depth D3 indicates a depth of the lower ends of the upper body regions 33. The depth D1 is a position shallower than the depth D3 of the lower end of the upper body region 33. In other words, here, n-type impurities are implanted at the depth D1 shallower than the depth D3 of the lower ends of the upper body regions 33. Furthermore, here, n-type impurities are implanted at a density higher (by a dose higher) than that of the p-type impurities implanted into the p-type impurities implanted region 33a. N-type impurities implanted regions 35a are thereby formed.

Next, the mask 60 is etched, and as shown in FIG. 5, the openings 60a of the mask 60 are enlarged. N-type impurities are then implanted into the upper surface 12a of the semiconductor substrate 12 through the mask 60 having the enlarged openings 60a. In other words, n-type impurities are implanted into the upper surface 12a located in the enlarged opening 60a. Here, n-type impurities are implanted at a depth D2 shallower than the depth D1. Furthermore, here, n-type impurities are implanted at a density lower (by a dose lower) than that of the n-type impurities implanted into the n-type impurities implanted region 35a. Due to this, n-type impurities implanted regions 35b are formed. Since each opening 60a of the mask 60 has been enlarged, a width of each n-type impurities implanted region 35b (i.e., a width in the x- and y-directions) becomes larger than the width of the corresponding n-type impurities implanted region 35a. In other words, the n-type impurities implanted region 35b that has a width larger than that of the n-type impurities implanted region 35a is formed above the n-type impurities implanted region 35a. When the n-type impurities implanted regions 35b have been formed, the mask 60 is removed.

Next, as shown in FIG. 6, a mask 62 is formed at the upper surface 12a of the semiconductor substrate 12. The mask 62 has openings 62a above regions where the contact regions 32 are to be formed. When the upper surface 12a of the semiconductor substrate 12 is viewed on plane, each opening 62a of the mask 62 extends in a ring shape so as to surround a periphery of the corresponding n-type impurities implanted region 35b. Next, p-type impurities are implanted into the upper surface 12a of the semiconductor substrate 12 through the mask 62. Here, p-type impurities are implanted at the depth D2 approximately equal to a depth of the n-type impurities implanted regions 35b (i.e., at the depth shallower than the depth D1). In other words, p-type impurities are implanted on both sides of each n-type impurities implanted region 35b. Furthermore, here, p-type impurities are implanted at a density higher (by a dose higher) than any of the density of p-type impurities implanted into the p-type impurities implanted region 33a and the density of n-type impurities implanted into the n-type impurities implanted regions 35b. Due to this, a p-type impurities implanted region 32a is formed. When the p-type impurities implanted region 32a has been formed, the mask 62 is removed.

Next, as shown in FIG. 7, a mask 64 is formed at the upper surface 12a of the semiconductor substrate 12. The mask 64 has openings above regions where the emitter regions 30 are to be formed. Next, n-type impurities are implanted into the upper surface 12a of the semiconductor substrate 12 through the mask 64. Here, n-type impurities are implanted at the depth D2 approximately equal to the depth of the n-type impurities implanted region 35b. Furthermore, here, n-type impurities are implanted at a density higher (by a dose higher) than that of n-type impurities implanted into the n-type impurities implanted region 35b. Due to this, n-type impurities implanted regions 30a are formed.

Next, activation annealing is performed. In other words, the semiconductor substrate 12 is heat treated to activate the n-type and p-type impurities implanted into the semiconductor substrate 12. As shown in FIG. 8, the lower body region 36, the barrier region 34, the upper body region 33, the pillar regions 35, the contact regions 32, and the emitter regions 30 are thereby formed. More specifically, the p-type impurities in the p-type impurities implanted region 36a are activated to form the lower body region 36. The n-type impurities in the n-type impurities implanted region 34a are activated to form the barrier region 34. The p-type impurities in the p-type impurities implanted region 33a are activated to form the upper body region 33. The n-type impurities in the n-type impurities implanted regions 35a and 35b are activated to form the pillar region 35. The p-type impurities in the p-type impurities implanted regions 32a are activated to form the contact regions 32. The n-type impurities in the n-type impurities implanted regions 30a are activated to form the emitter regions 30.

Figure 9:
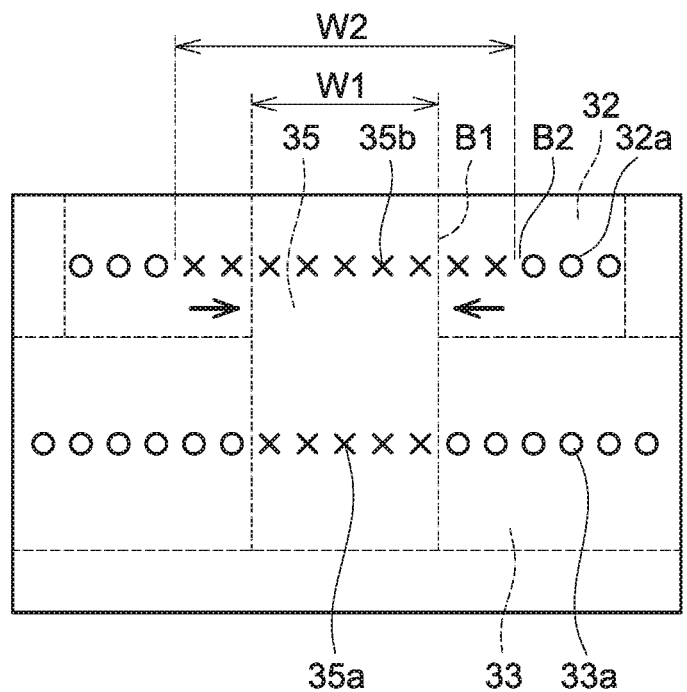
FIG. 9 is a vertical cross section that shows regions before and after the activation annealing in a superimposed manner.

FIG. 9 shows positions of the impurities implanted regions 32a, 33a, 35a, and 35b, the contact regions 32, the upper body region 33, and the pillar regions 35 in a manner that the positions are superimposed. As described above, the density of p-type impurities in the p-type impurities implanted region 32a is higher than the density of n-type impurities in the n-type impurities implanted region 35b. Accordingly, as shown in FIG. 9 by arrows, in the activation annealing, a large amount of p-type impurities are diffused toward n-type impurities implanted region 35b side from the p-type impurities implanted regions 32a. Therefore, the contact regions 32 are formed to be enlarged toward the pillar region 35 side with respect to the p-type impurities implanted regions 32a. In other words, a position of a boundary B1 between each contact region 32 and each pillar region 35 is shifted toward the n-type impurities implanted region 35b side with respect to a position B2 of a boundary between each p-type impurities implanted region 32a and each n-type impurities implanted region 35b. Therefore, a width W1 of each pillar region 35 is smaller than a width W2 of each n-type impurities implanted region 35b obtained before the activation annealing.

On the other hand, there is no significant difference in density of the impurities between the n-type impurities implanted regions 35a and the p-type impurities implanted regions 33a. Accordingly, at a deep position, the width of each pillar region 35 hardly changes from the width of each n-type impurities implanted region 35a obtained before the activation annealing.

As described above, before the activation annealing, the width W2 of each n-type impurities implanted region 35b at the shallow position is larger than the width of each n-type impurities implanted region 35a at the deep position. Furthermore, by the activation annealing, the pillar region 35 is formed in a range having a width smaller than that of each n-type impurities implanted region 35b, at the shallow position, and in a range having a width approximately equal to that of each n-type impurities implanted region 35a, at the deep position. Therefore, the widths of the pillar region 35 at the shallow position and at the deep position are approximately equal to each other. According to this method, it is therefore possible to form the pillar region 35 that have little difference in width between its shallow position and its deep position thereof.

Figure 10:
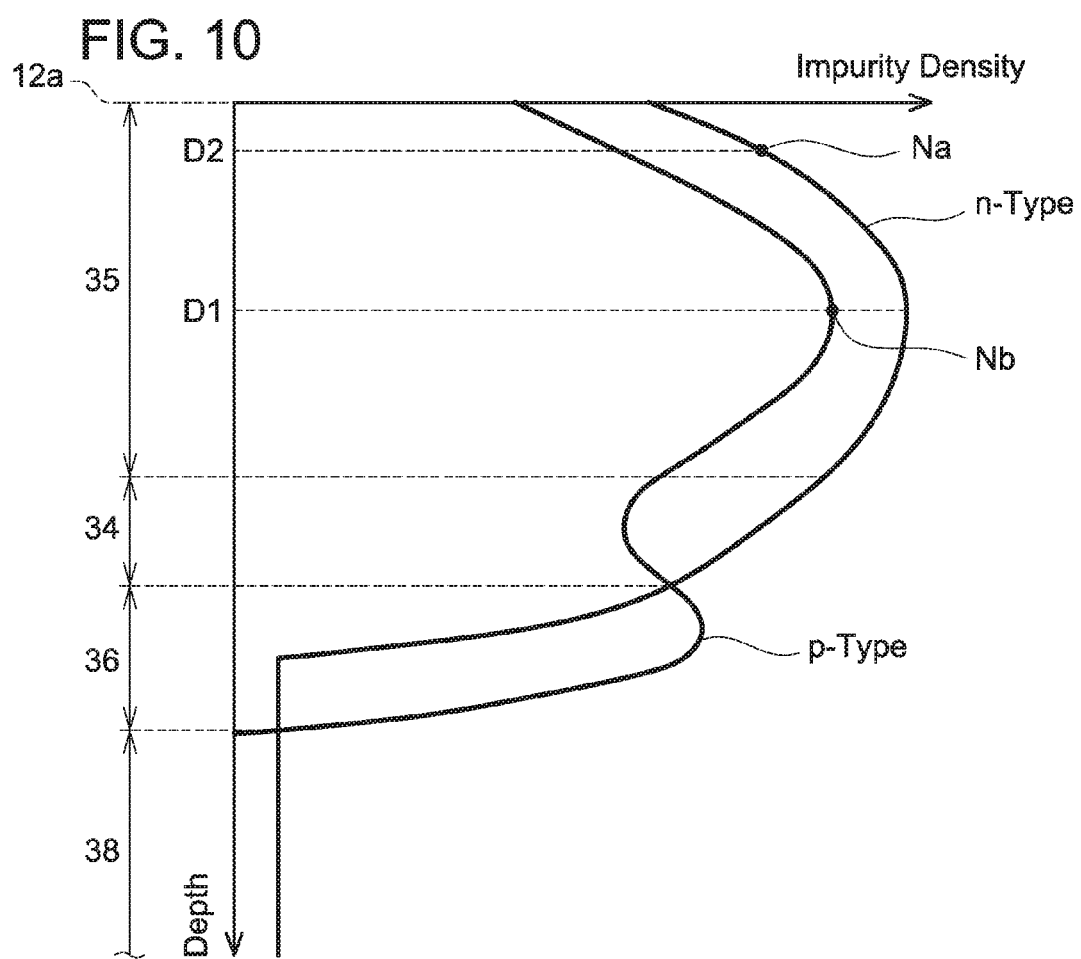
FIG. 10 is a diagram that shows impurity density distribution on a line A1 in FIG. 8 after the activation annealing.

Furthermore, FIG. 10 shows impurity density distribution on a line Al in FIG. 8. As described above, when p-type impurities are implanted into the upper body region 33, the p-type impurities are also implanted into the pillar region 35, and hence the density of p-type impurities in the pillar region 35 is relatively high. The density of p-type impurities in the pillar regions 35 reaches a peak density Nb at a depth approximately equal to the depth D1, and becomes lower toward the upper side. Note that p-type impurities are also distributed in the upper body region 33 just as in FIG. 10. The implantation of n-type impurities into the pillar regions 35 is performed at the deep position (the depth D1) at a density higher than that at the shallow position (the depth D2). Therefore, the density of n-type impurities in the pillar regions 35 is lower at the shallow position (the depth D2) than at the deep position (the depth D1). A density Na of n-type impurities at the shallow position (the depth D2) is lower than the density Nb of p-type impurities at the deep position (the depth D1).

When the activation annealing is completed, the trenches 14 are formed in the upper surface 12a of the semiconductor substrate 12, and the gate insulation film 16 and the gate electrode 18 are formed inside each trench 14. Next, the interlayer insulation films 20 and the upper electrode 22 are formed on the upper surface 12a of the semiconductor substrate 12. Next, the buffer region 39, the collector regions 40, and the cathode region 42 are formed on a lower surface 12b side of the semiconductor substrate 12 by impurities implantation. Next, the lower electrode 26 is formed on the lower surface 12b of the semiconductor substrate 12. Afterwards, the semiconductor substrate 12 is diced into chips. The above-described semiconductor device 10 is thereby completed.

As described above, according to this method, it is possible to suppress the width difference in the pillar regions 35 between its shallow position and its deep position. Various advantages can thereby be obtained, which will hereinafter be described in comparison with a semiconductor device in a comparative example.

Figure 11:
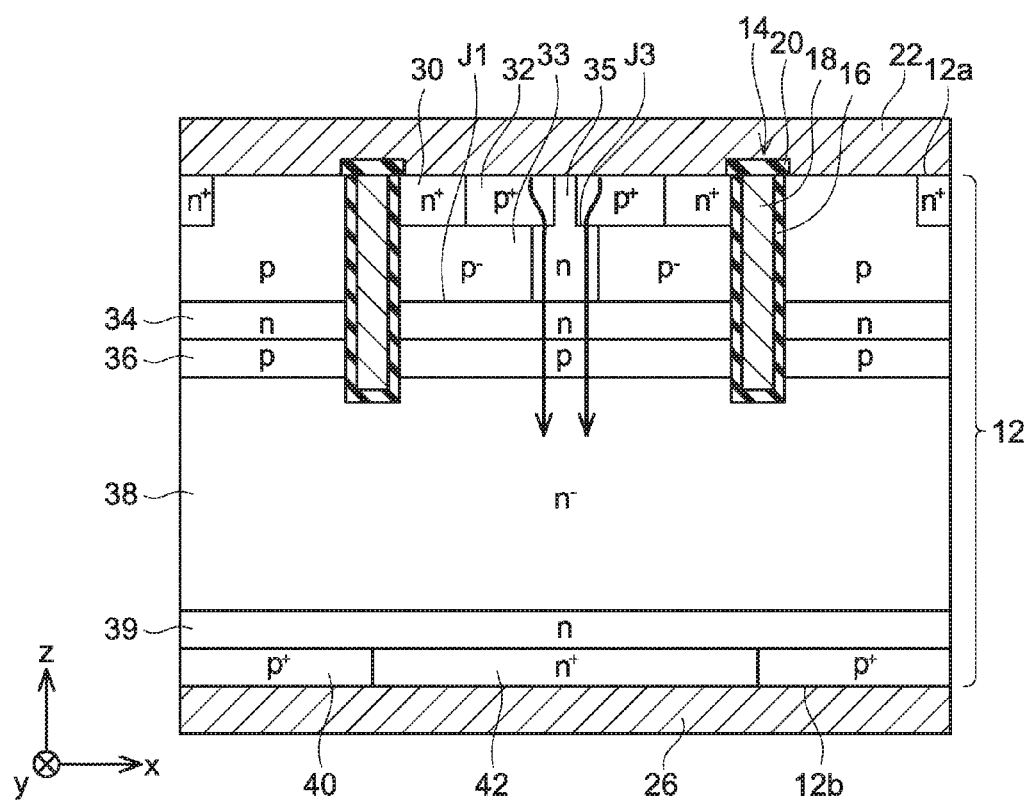
FIG. 11 is a vertical cross section of a semiconductor device manufactured by a method in a comparative example.

In the semiconductor device in the comparative example shown in FIG. 11, a width of a pillar region 35 becomes smaller at its shallow position than at its deep position. Therefore, resistance of the pillar region 35 increases, and the hole injection suppressing effect is hard to be obtained. Furthermore, in the structure shown in FIG. 11, if the width of the pillar region 35 at the shallow position is enlarged so as to decrease the resistance of the pillar region 35, the width of the pillar region 35 at the deep position becomes even larger, causing an increase in element size. As such, if the width of the pillar region 35 is unnecessarily increased, the spacing between two trenches 14 becomes large, and the above-described carrier accumulation effect is weakened. Consequently, the on-resistance of the IGBT becomes high. In contrast, in the semiconductor device 10 manufactured by the method according to the present embodiment, the width difference in the pillar region 35 between its shallow position and its deep position is small, and hence even if the width of the pillar region 35 is sufficiently ensured at the shallow position, its width at the deep position does not become excessively large. Therefore, a high carrier accumulation effect can be obtained without increasing the element size. Furthermore, since the width of each pillar region 35 is not increased unnecessarily, the spacing between the two trenches 14 can be decreased, and hence a high carrier accumulation effect can be obtained.

Furthermore, as described above, the density of n-type impurities in the pillar region 35 is low at the shallow position and high at the deep position. As shown in FIG. 11, when a contact region 32 protrudes toward a pillar region 35 side, the pillar region 35 at the deep position (i.e., the region where the density of n-type impurities is high) becomes adjacent to the contact region 32 (i.e., the region where the density of p-type impurities is high) in an upward and downward direction via a boundary J3. As such, when the p-type region with a high density and the n-type region with a high density are adjacent to each other, a barrier of a pn junction at the boundary J3 becomes small. Therefore, in an operation of the diode, holes flow into a barrier region 34 and a drift region 38 via the boundary J3, as shown in FIG. 11 by arrows. Therefore, in the structure in FIG. 11, the hole injection suppressing effect is weakened. In contrast, in the semiconductor device 10 manufactured in the present embodiment, it is possible to suppress the contact region 32 protruding toward the pillar region 35 side. Accordingly, the flow of holes as shown by the arrows in FIG. 11 hardly occurs, and the high hole injection suppressing effect can be obtained. Furthermore, in the method according to the present embodiment, the density of n-type impurities at the shallow position is lower than the density of p-type impurities at the deep position, in each pillar region 35. By decreasing the density of n-type impurities at the shallow position as such, it is possible to heighten the barrier of the pn junction at the boundary between the pillar region 35 and the contact region 32, at the shallow position. This makes it possible to suppress the flow of holes via this pn junction and obtain a even higher hole injection suppressing effect. Note that, in order to more effectively suppress the inflow of holes as shown by the arrows in FIG. 11, the width of each pillar region 35 may be made smaller at the deep position than at the shallow position.

Note that, although the p-type impurities implanted regions 32a and the n-type impurities implanted regions 35b are formed at approximately the same depths D2 in the above-described embodiment, these depths do not have to be precisely equal to each other, and may be different in some degree. Furthermore, although the p-type impurities implanted regions 33a and the n-type impurities implanted regions 35a are formed at approximately the same depths D1 in the above-described embodiment, these depths do not have to be precisely equal to each other, and may be different in some degree.

Figure 12:
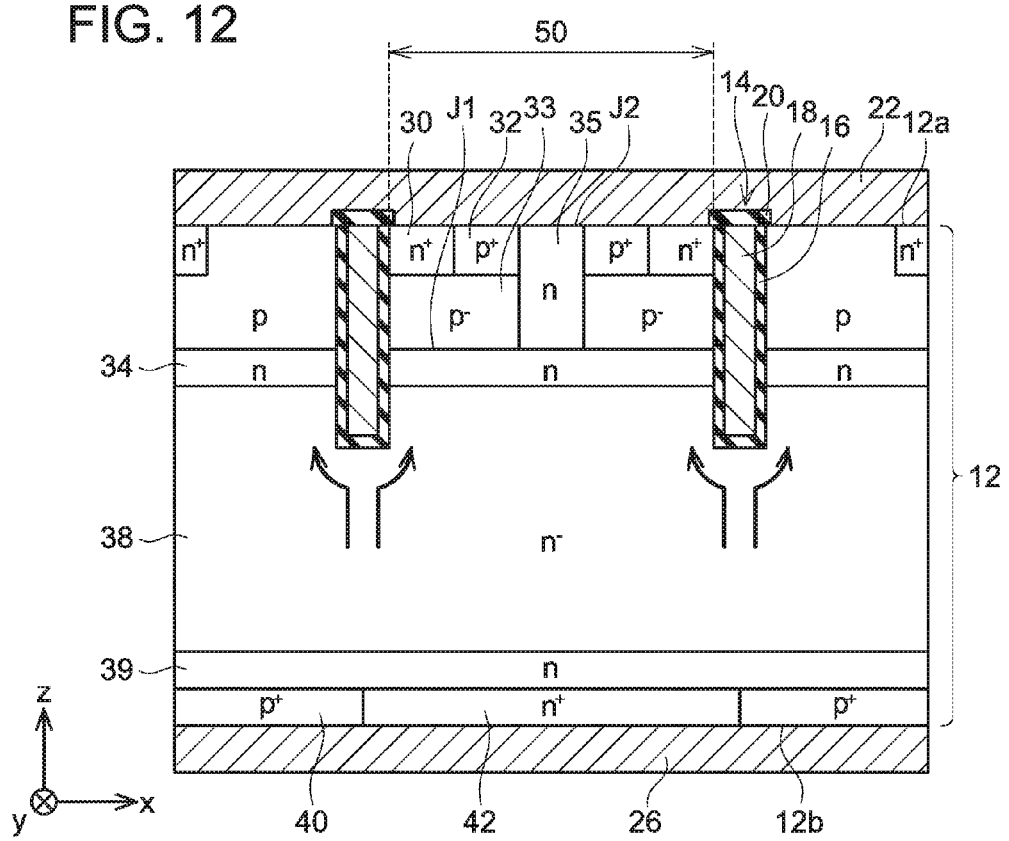
FIG. 12 is a vertical cross section of a semiconductor device in a variation.

Furthermore, although the semiconductor device 10 in the above-described embodiment has the lower body regions 36, it may not have the lower body regions 36 as shown in FIG. 12. In other words, the barrier regions 34 may be linked directly to the drift region 38.

Furthermore, although each contact region 32 is formed to surround the periphery of the corresponding pillar region 35 in the semiconductor device 10 in the above-described embodiment, each contact region 32 may simply need to be formed on both sides of the corresponding pillar region 35 in a prescribed direction (e.g., in the x- or y-direction), and may not need to be located in the entire periphery of the pillar region 35. Furthermore, in the case where each contact region 32 is located on both sides of the pillar region 35 in a prescribed direction, the n-type impurities implanted region 35b at the shallow position may be formed in a range wider than that of the n-type impurities implanted region 35a at the deep position in that prescribed direction.

Furthermore, although the lower body regions 36, the barrier regions 34, and the upper body regions 33 are formed by ion implantation and activation annealing in the above-described embodiment, all or part of them may be formed by epitaxial growth.

Furthermore, although the ion implantations are performed in an order of the p-type impurities implanted region 36a, the n-type impurities implanted region 34a, the p-type impurities implanted region 33a, the n-type impurities implanted regions 35a, the n-type impurities implanted regions 35b, the p-type impurities implanted regions 32a, and the n-type impurities implanted regions 30a in the above-described embodiment, the order of the ion implantations may be changed freely. Furthermore, although the impurities in all of these regions are activated by the single heat treatment in the above-described embodiment, heat treatment for one or some of the regions may be performed in another step.

Furthermore, although the semiconductor device that includes diodes and IGBTs is described in the above-described embodiment, the technology disclosed in the present specification may be used for the step of manufacturing a diode that has no IGBT.

Furthermore, although the mask 60, which is used in the implantation step for the n-type impurities implanted regions 35a, is used again in the implantation step for the n-type impurities implanted regions 35b after the openings 60a are enlarged in the above-described embodiment, different masks may be used for these steps.

Furthermore, although p-type impurities are also implanted into the pillar regions 35 when the ion implantation is performed to the upper body regions 33 in the above-described embodiment, p-type impurities may not be implanted into the pillar regions 35.

Furthermore, although the pillar regions 35 are in Schottky-contact with the upper electrode 22 in the above-described embodiment, the pillar regions 35 may be in ohmic contact with the upper electrode 22.

There will be described a relation between each element in the above-described embodiment and each element in the claims. Each upper body region 33 in the embodiment is an example of a body region in the claims. Each opening 60a before being enlarged in the embodiment is an example of a first range in the claims. Each opening 60a after being enlarged in the embodiment is an example of a second range in the claims. Each opening 62a in the embodiment is an example of a third range in the claims. The implantation range of p-type impurities for the p-type impurities implanted region 33a (the entire upper range of the region to form the IGBTs and the diodes) in the embodiment is an example of a fourth range in the claims. The depth D1 in the embodiment is an example of a first depth and a fourth depth in the claims. The depth D2 in the embodiment is an example of a second depth and a third depth in the claims. The upper electrode 22 in the embodiment is an example of an anode electrode in the claims.

Some of the technological elements disclosed in the present specification will hereinafter be enumerated. Note that the technological elements below are each independently useful.

A method disclosed herein as an example further may comprise a fourth implantation and a second heating. In the fourth implantation, p-type impurities are implanted into a fourth range of an upper surface of a semiconductor substrate at a fourth depth. The fourth range includes the second range and the third range as a part. The fourth depth is deeper than the second depth and the third depth. In the second heating, the semiconductor substrate is heated so that a second p-type region is formed in a part of a region into which the p-type impurities are implanted in the fourth implantation. The second p-type region serves as the body region. In the first implantation, the n-type impurities are implanted at a density higher than a density of the n-type impurities implanted in the second implantation.

Note that the second heating may be performed simultaneously with the first heating.

In this method, p-type impurities are implanted into the fourth range of the upper surface of the semiconductor substrate at the deep position (the fourth depth) in the fourth implantation and the p-type impurities are activated in the second heating, to thereby form the body region. In the fourth implantation, p-type impurities are implanted into the entire range where the pillar region and the body region should be formed (i.e., the fourth range that includes the second and third ranges and is wider than these ranges), without distinguishing between the pillar region and the body region. By implanting p-type impurities without discriminating between the body region and the pillar region as such, preparation of a mask exclusively used for forming the body region becomes unnecessary. When p-type impurities are implanted at the deep position (the fourth depth) to form the body region as such, the p-type impurities are distributed in the pillar region such that the density thereof becomes higher at the first depth (the deep position) than at the second depth (the shallow position). Furthermore, in the first implantation, n-type impurities are implanted at a density higher than in the second implantation step. When n-type impurities are implanted as such, the density of n-type impurities is low in the pillar region at the shallow position and high at the deep position. Even with such density distribution of n-type impurities, the entire region to form the pillar region can be made n-type, and the pillar region can suitably be formed. Furthermore, if a region having a high density of n-type impurities is adjacent to the contact region having a high density of p-type impurities, the barrier becomes smaller at the pn junction of the interface between the region with the high density and the contact region, and a current leaks via this pn junction. In contrast, by decreasing the density of n-type impurities at the shallow position in the pillar region as described above, current leakage can be suppressed. Furthermore, in an event that the width of the pillar region at the deep position is excessively larger than that of the pillar region at the shallow position, the contact region will exist above the pillar region at the deep position, causing the contact region and the pillar region at the deep position to be adjacent to each other. In other words, the contact region having the high density of p-type impurities and the pillar region at the deep position having the high density of n-type impurities are adjacent to each other in the upward and downward direction, and a current leaks at the interface between the contact region and the pillar region at the deep position. In this method, however, the width difference in the pillar region between its shallow position and its deep position is hardly generated, and hence it is possible to prevent the pillar region at the deep position from being adjacent to the contact region. Accordingly, a leak current between the contact region and the pillar region at the deep position can be suppressed.

In a method disclosed herein as an example, after the body region and the pillar region are formed, a density of the n-type impurities in the pillar region at the second depth may be lower than a density of the p-type impurities in the pillar region at the first depth.

As such, by decreasing the density of n-type impurities in the pillar region at the shallow position (i.e., the second depth), the leak current can be suppressed more suitably.

A diode manufactured by a method disclosed herein as an example may further comprise a plurality of trench gates being in contact with the body region and the barrier region; an emitter region being of n-type, located between the trench gates, and being in contact with the trench gates and the anode electrode; and a collector region being of p-type and located on a lower side of the barrier region. The contact region and the pillar region are located between the trench gates.

Note that the plurality of trench gates, the emitter region, and the collector region may be formed by any step at any timing.

Inside the diode manufactured by this method, an IGBT is formed with the trench gates, the emitter region, the body region, the barrier region, and the collector region. As described above, the width of the pillar region can be uniformized in this method, and hence the spacing between the plurality of trench gates can be decreased. By decreasing the spacing between the trench gates as such, the on-resistance of the IGBT can be decreased.

In a method disclosed herein as an example, the n-type impurities may be implanted through a mask having an opening in the first implantation, and the mask is etched in the second implantation so as to enlarge the opening and the n-type impurities are implanted through the mask after being etched.

According to this method, it is not necessary to make another mask for the second implantation after the first implantation. It is possible to use a common mask just by enlarging the width of its opening. Accordingly, the diode can efficiently be manufactured.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

What is claimed is:

1. A method for manufacturing a diode that comprises:
   an anode electrode;
   a contact region being of p-type and in contact with the anode electrode;
   a body region being of p-type, located on a lower side of the contact region, and having a density of p-type impurities lower than that in the contact region;
   a barrier region being of n-type and located on a lower side of the body region; and
   a pillar region being of n-type and extending from a position being in contact with the anode electrode to the barrier region by penetrating the contact region and the body region,
   the method comprising:
   providing a first implantation in which n-type impurities are implanted into a first range of an upper surface of a semiconductor substrate at a first depth;
   providing a second implantation in which the n-type impurities are implanted into a second range of the upper surface at a second depth, the second range including the first range as a part, and the second depth being shallower than the first depth;
   providing a third implantation in which the p-type impurities are implanted into a third range of the upper surface at a third depth at a density higher than a density of the n-type impurities implanted in the second implantation, the third range being located on both sides of the second range, and the third depth being shallower than the first depth; and
   providing a first heating in which the semiconductor substrate is heated so that a first p-type region is formed in a region into which the p-type impurities were implanted in the third implantation and a first n-type region is formed in a part of a region into which the n-type impurities were implanted in the first and second implantations,
   wherein
   the first p-type region serves as the contact region, and the first n-type region serves as the pillar region.

2. The method of claim 1, further comprising:
   providing a fourth implantation in which the p-type impurities are implanted into a fourth range of the upper surface at a fourth depth, the fourth range including the second range and the third range as a part, and the fourth depth being deeper than the second depth and the third depth; and
   providing a second heating in which the semiconductor substrate is heated so that a second p-type region is formed in a part of a region into which the p-type impurities were implanted in the fourth implantation,
   wherein
   the second p-type region serves as the body region, and
   in the first implantation, the n-type impurities are implanted at a density higher than a density of the n-type impurities implanted in the second implantation.

3. The method of claim 2, wherein, after the body region and the pillar region are formed, a density of the n-type impurities in the pillar region at the second depth is lower than a density of the p-type impurities in the pillar region at the first depth.

4. The method of claim 1, wherein
   the diode further comprises:
   a plurality of trench gates being in contact with the body region and the barrier region;
   an emitter region being of n-type, located between the trench gates, and being in contact with the trench gates and the anode electrode; and
   a collector region being of p-type and located on a lower side of the barrier region, and
   the contact region and the pillar region are located between the trench gates.

5. The method of claim 1, wherein
   in the first implantation, the n-type impurities are implanted through a mask having an opening, and
   in the second implantation, the mask is etched so as to enlarge the opening and the n-type impurities are implanted through the mask after being etched.

* * * * *